US011936372B2

(12) United States Patent
Sul et al.

(10) Patent No.: US 11,936,372 B2
(45) Date of Patent: Mar. 19, 2024

(54) SLEW RATE ADJUSTING CIRCUIT FOR ADJUSTING SLEW RATE, BUFFER CIRCUIT INCLUDING SAME, AND SLEW RATE ADJUSTING METHOD

(71) Applicant: Magnachip Semiconductor, Ltd., Cheongju-si (KR)

(72) Inventors: Jung Hoon Sul, Seoul (KR); Dong Il Seo, Seoul (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 18/188,144

(22) Filed: Mar. 22, 2023

(65) Prior Publication Data

US 2023/0223935 A1    Jul. 13, 2023

Related U.S. Application Data

(62) Division of application No. 16/830,387, filed on Mar. 26, 2020, now Pat. No. 11,641,199.

(30) Foreign Application Priority Data

Jun. 7, 2019   (KR) ......................... 10-2019-0067454

(51) Int. Cl.
*H03K 17/16* (2006.01)
*H03F 3/45* (2006.01)
*H03K 5/04* (2006.01)

(52) U.S. Cl.
CPC ....... *H03K 17/161* (2013.01); *H03F 3/45179* (2013.01); *H03K 5/04* (2013.01); *H03F 2200/552* (2013.01); *H03F 2203/45248* (2013.01)

(58) Field of Classification Search
CPC ........ H03K 17/161; H03K 5/04; H03F 1/226; H03F 1/223
See application file for complete search history.

(56) References Cited

U.S. PATENT DOCUMENTS

| 5,317,281 A * | 5/1994 | Vinn ...................... H03F 3/3076 330/265 |
| 2015/0084694 A1 * | 3/2015 | Lee ......................... H03F 1/483 327/170 |

FOREIGN PATENT DOCUMENTS

| KR | 10-2015-0033161 A | 4/2015 |
| KR | 10-2017-0073481 A | 6/2017 |

OTHER PUBLICATIONS

Korean Office Action dated Sep. 4, 2023, in counterpart Korean Patent Application No. 10-2019-0067454 (8 pages in English, 7 pages in Korean).

* cited by examiner

*Primary Examiner* — Patrick C Chen
(74) *Attorney, Agent, or Firm* — NSIP Law

(57) ABSTRACT

A slew rate adjusting circuit includes an adjustment transistor configured to provide an adjustment current into an output port of an arithmetic amplifier, a first transistor connected between a power line of the arithmetic amplifier and the adjustment transistor, and a second transistor connected between the first transistor and an output node of the output port, wherein the adjustment transistor is turned on by the second transistor in response to a difference between an input voltage and an output voltage being equal to or greater than a reference voltage, and the adjustment current is provided to the output port in response to the adjustment transistor being turned on.

8 Claims, 7 Drawing Sheets

SLEW RATE ADJUSTING CIRCUIT FOR ADJUSTING SLEW RATE, BUFFER CIRCUIT INCLUDING SAME, AND SLEW RATE ADJUSTING METHOD

CROSS REFERENCE TO RELATED APPLICATIONS

This application is a division of U.S. application Ser. No. 16/830,387, filed on Mar. 26, 2020 which claims the benefit under 35 USC 119(a) of Korean Patent Application No. 10-2019-0067454, filed on Jun. 7, 2019 in the Korean Intellectual Property Office, the entire disclosure of which is incorporated herein by reference for all purposes.

BACKGROUND

1. Field

The following description relates to a slew rate adjusting circuit. The following description also relates to a buffer circuit including a slew rate adjusting circuit. The following description also relates to a slew rate adjusting method.

2. Description of the Related Art

A buffer circuit may be used for performing a buffer function on a signal. For example, the buffer circuit may be used in various fields of outputting an output signal such as a source driving circuit and a gate driving circuit of a display device, and so on.

Meanwhile, in the display field, because of an increase in capacitance and a decrease in horizontal frequency caused by enlargement of circuits, a slew rate of the buffer circuit may become a factor that is to be considered when forming the buffer circuit.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a slew rate adjusting circuit includes an adjustment transistor configured to provide an adjustment current into an output port of an arithmetic amplifier, a first transistor connected between a power line of the arithmetic amplifier and the adjustment transistor, and a second transistor connected between the first transistor and an output node of the output port, wherein the adjustment transistor is turned on by the second transistor in response to a difference between an input voltage and an output voltage being equal to or greater than a reference voltage, and the adjustment current is provided to the output port in response to the adjustment transistor being turned on.

The adjustment current may be provided from the power line into the output node through the adjustment transistor.

The second transistor may be turned on in response to the difference between the input voltage and the output voltage being equal to or greater than the reference voltage, the adjustment transistor may be turned on in response to the second transistor being turned on, and the adjustment current may be provided to the output node through the adjustment transistor in response to the adjustment transistor being turned on.

The adjustment transistor, the first transistor, and the second transistor may be metal-oxide-semiconductor field-effect transistors (MOSFETs), a source terminal of the second transistor may be connected to the output node, a drain terminal of the second transistor may be connected to a gate terminal of the adjustment transistor, a source terminal of the adjustment transistor may be connected to the power line, and a drain terminal of the adjustment transistor may be connected to the output node.

The adjustment transistor and the second transistor may be metal-oxide-semiconductor field-effect transistors (MOSFETs), a source terminal of the second transistor may be connected to the output node, a drain terminal of the second transistor may be connected to a gate terminal of the adjustment transistor, a source terminal of the adjustment transistor may be connected to the power line, and a drain terminal of the adjustment transistor may be connected to the output node.

The slew rate adjusting circuit may further include an enable transistor connected to the adjustment transistor, the first transistor, and the second transistor, wherein the enable transistor may be configured to control whether or not to turn on the second transistor in response to receiving an enable signal.

A positive adjustment current may be provided through the adjustment transistor in response to the arithmetic amplifier operating through a pull-up current.

A negative adjustment current may be provided through the adjustment transistor in response to the arithmetic amplifier operating through a pull-down current.

The slew rate adjusting circuit may further include an additional transistor connected to the adjustment transistor, the first transistor, and the second transistor, wherein the second transistor may be configured to turn on the additional transistor in response to the difference between the input voltage and the output voltage being equal to or greater than the reference voltage, and an additional current may be provided to the output node in response to the additional transistor being turned on.

In another general aspect, a buffer circuit includes an arithmetic amplifier configured to output an output voltage through an output node by amplifying an input voltage, an adjustment current generating circuit configured to provide adjustment current to an output port of the arithmetic amplifier so as to adjust a slew rate of the output port, and a control circuit configured to control the adjustment current generating circuit so as to provide the adjustment current in response to a difference between the input voltage and the output voltage being equal to or greater than a reference voltage.

The adjustment current generating circuit may further include an adjustment transistor connected between a power line of the arithmetic amplifier, the output node, and the control circuit, wherein the adjustment current may be provided to the output node through the adjustment transistor by the adjustment transistor being turned on according to a control of the control circuit, in response to the difference between the input voltage and the output voltage being equal to or greater than the reference voltage.

The adjustment current may be provided from the power line to the output node through the adjustment transistor.

The control circuit may include a first transistor connected to the power line, and a second transistor connected between the first transistor and the output node, wherein the adjustment transistor may be turned on by the second transistor in response to the difference between the input voltage and the output voltage being equal to or greater than the reference voltage.

The adjustment transistor and the second transistor may be metal-oxide-semiconductor field-effect transistors (MOSFETs), wherein a source terminal of the second transistor may be connected to the output node, a drain terminal of the second transistor may be connected to a gate terminal of the adjustment transistor, a source terminal of the adjustment transistor may be connected to the power line, and a drain terminal of the adjustment transistor may be connected to the output node.

The buffer circuit may further include an enable transistor connected to the adjustment transistor, the first transistor, and the second transistor, wherein the enable transistor may be configured to control whether or not to turn on the second transistor in response to an enable signal.

The buffer circuit may further include an additional transistor connected to the adjustment transistor, the first transistor, and the second transistor, wherein the additional transistor may be turned on by the second transistor in response to the difference between the input voltage and the output voltage being equal to or greater than the reference voltage, and additional current may be provided to the output node in response to the additional transistor being turned on.

In another general aspect, a slew rate adjusting method includes receiving an input voltage input to an arithmetic amplifier, receiving an output voltage output from the arithmetic amplifier, and providing adjustment current to an output port of the arithmetic amplifier on the basis of a difference between the input voltage and the output voltage so as to decrease a transition time of the output voltage.

The providing of the adjustment current may include providing the adjustment current in response to the difference between the input voltage and the output voltage being equal to or greater than a reference voltage.

A slew rate of an example where the difference between the input voltage and the output voltage is equal to or greater than the reference voltage may be greater than a slew rate of an example where the difference between the input voltage and the output voltage is smaller than the reference voltage.

A size of the adjustment current may be determined on the basis of the difference between the input voltage and the output voltage.

In another general aspect, a slew rate adjusting circuit includes an adjustment transistor, a first transistor connected between a power line of an arithmetic amplifier and the adjustment transistor, and a second transistor connected between the first transistor and an output node of an output port of the arithmetic amplifier, wherein the adjustment transistor is turned on by the second transistor in response to a difference between an input voltage and an output voltage being equal to or greater than a reference voltage, and the adjustment transistor provides an adjustment current into the output port in response to being turned on.

The adjustment current may be provided from the power line into the output node through the adjustment transistor.

The second transistor may be turned on in response to the difference between the input voltage and the output voltage being equal to or greater than the reference voltage, the adjustment transistor may be turned on in response to the second transistor being turned on, and the adjustment current may be provided to the output node through the adjustment transistor in response to the adjustment transistor being turned on.

The adjustment transistor, the first transistor, and the second transistor may be metal-oxide-semiconductor field-effect transistors (MOSFETs), a source terminal of the second transistor may be connected to the output node, a drain terminal of the second transistor may be connected to a gate terminal of the adjustment transistor, a source terminal of the adjustment transistor may be connected to the power line, and a drain terminal of the adjustment transistor may be connected to the output node.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
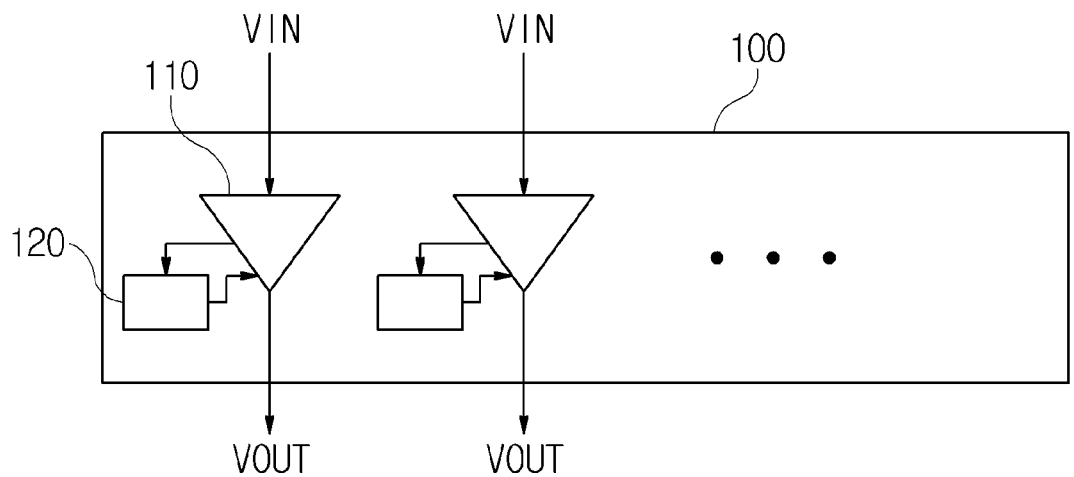
FIG. 1 is a view showing a buffer circuit according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The examples have been made keeping in mind the above problems occurring in the related art, and an objective of the examples is to provide a slew rate adjusting circuit capable of improving a slew rate of an output port of an arithmetic amplifier without an increase in current consumption in the output port, a buffer circuit including the same, and a slew rate adjusting method.

A slew rate adjusting circuit according to examples may improve a slew rate of the arithmetic amplifier by providing an adjustment current to the arithmetic amplifier when a difference between an input voltage and an output voltage exceeds a threshold voltage, providing for a Fast Slew.

A slew rate adjusting circuit according to examples may increase a slew rate in the output port without causing a change in consumption current in the output port, and thus a device may be prevented from being heated excessively.

FIG. 1 is a view showing a buffer circuit according to an example. Referring to the example of FIG. 1, a buffer circuit 100 may receive an input voltage VIN, and may output an output voltage VOUT by using the input voltage VIN. According to examples, the buffer circuit 100 may perform a buffer function on the input voltage VIN, and may output the output voltage VOUT that is the result of the buffer function. For example, the output voltage VOUT may be generated by the buffer circuit 100 by amplifying the input voltage VIN.

Meanwhile, in the present disclosure, receiving an arbitrary voltage may mean that a line, from which the arbitrary voltage is supplied, and a corresponding configuration are electrically connected.

The buffer circuit 100 may include an arithmetic amplifier 110 and a slew rate adjusting circuit 120. According to non-limiting examples, the buffer circuit 100 may include a plurality of arithmetic amplifiers and a plurality of slew rate adjusting circuits, but a single arithmetic amplifier 110 and a slew rate adjusting circuit 120 may suffice, in other non-limiting examples.

The arithmetic amplifier 110 may output the output voltage VOUT by amplifying the input voltage VIN. Ideally, the arithmetic amplifier 110 may output the output voltage VOUT by immediately responding to the input of the input voltage VIN. However, practically, in a transition from the input voltage VIN to the output voltage VOUT, a time, that is, a transition time, may elapse. Such a transition time may be considered as being a slew rate for the arithmetic amplifier 110.

The slew rate adjusting circuit 120 may adjust a slew rate of the arithmetic amplifier 110. According to an example, the slew rate adjusting circuit 120 may receive the input voltage VIN and the output voltage VOUT from the arithmetic amplifier 110, and may adjust a transition time from the input voltage VIN to the output voltage VOUT on the basis of the received input voltage VIN and the output voltage VOUT. For example, the slew rate adjusting circuit 120 may be activated when an absolute value of a difference between the input voltage VIN and the output voltage VOUT of the arithmetic amplifier 110 exceeds a reference value, and may accordingly decrease a transition time from the input voltage VIN to the output voltage VOUT.

Figure 2:
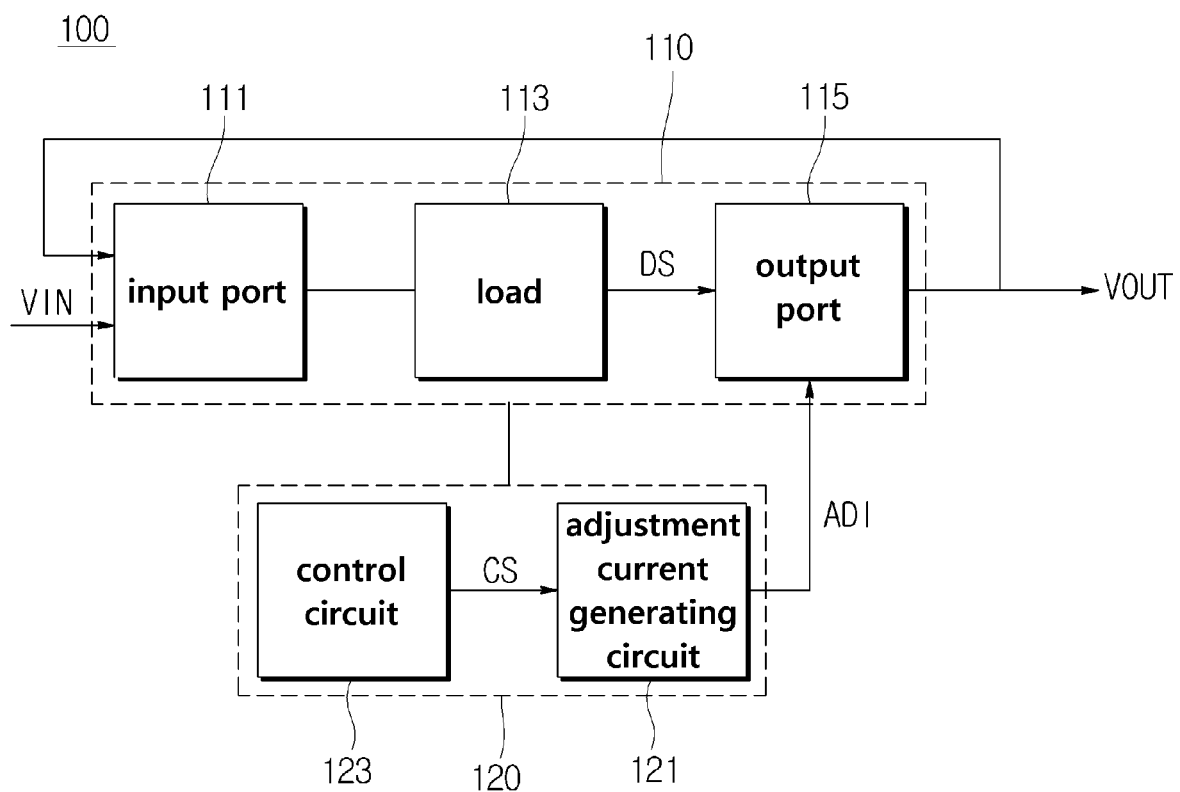
FIG. 2 is a view showing an arithmetic amplifier and a slew rate adjusting circuit according to an example.

FIG. 2 is a view showing the arithmetic amplifier and the slew rate adjusting circuit according to an example. Referring to the examples of FIGS. 1 and 2, the arithmetic amplifier 110 may include an input port 111, a load 113, and an output port 115.

The input port 111 may receive the input voltage VIN and the output voltage VOUT, and may determine a difference in size between the input voltage VIN and the output voltage VOUT. Also, in the example of FIG. 2, the input port 111 of the arithmetic amplifier 110 may be electrically connected to the load 113.

The load 113 may determine a gain of the arithmetic amplifier 110. According to an example, the load 113 may amplify the input voltage VIN according to the determined gain, and may transfer the resulting input voltage to the output port 115.

The load 113 may transmit a driving signal DS so as to control the output port 115. For example, the driving signal DS may be a pull-up current or a pull-down current used in the arithmetic amplifier 110.

The output port 115 may output the output voltage VOUT in response to the driving signal DS. According to an example, the output port 115 may output the output voltage VOUT as a result of being turned on by the driving signal DS.

The output port 115 may receive adjustment current ADI from the slew rate adjusting circuit 120, and as a result, the slew rate of the output port 115 can be adjusted.

The output voltage VOUT output from the output port 115 may be provided to the input port 111 again.

According to the example of FIG. 2, the slew rate adjusting circuit 120 may include an adjustment current generating circuit 121 and a control circuit 123.

In such an example, the adjustment current generating circuit 121 may be connected to the output port 115 of the arithmetic amplifier 110. The adjustment current generating circuit 121 may adjust a slew rate of the output port 115 by providing an adjustment current ADI to the output port 115. According to an example, the adjustment current generating circuit 121 may provide the adjustment current ADI to the output port 115. Thus, the adjustment current generating circuit 121 may adjust a slew rate of the output port 115 by enabling a transition from the input voltage VIN to the output voltage VOUT to be faster than the slew rate was before, at an earlier time when the input voltage VIN is transitioned to the output voltage VOUT through the output port 115.

Meanwhile, a direction of the current flowing of the adjustment current ADI is not limited, providing that, by the operation of adjustment current generating circuit 121, an adjustment current ADI to the output port 115 may include an example where current flows from the output port 115 into the adjustment current generating circuit 121, and an example where current flows from the adjustment current generating circuit 121 into the output port 115.

The control circuit 123 may output a control signal CS for controlling the adjustment current generating circuit 121. According to an example, the control circuit 123 may output a control signal CS into the adjustment current generating circuit 121 according to a difference between the input voltage VIN and the output voltage VOUT. Also, the adjustment current generating circuit 121 may provide adjustment current ADI into the output port 115 by being activated or enabled, in response to the control signal CS.

The slew rate adjusting circuit 120 according to an example may adjust a slew rate of the output port 115 according to a difference between the input voltage VIN and the output voltage VOUT.

Figure 3:
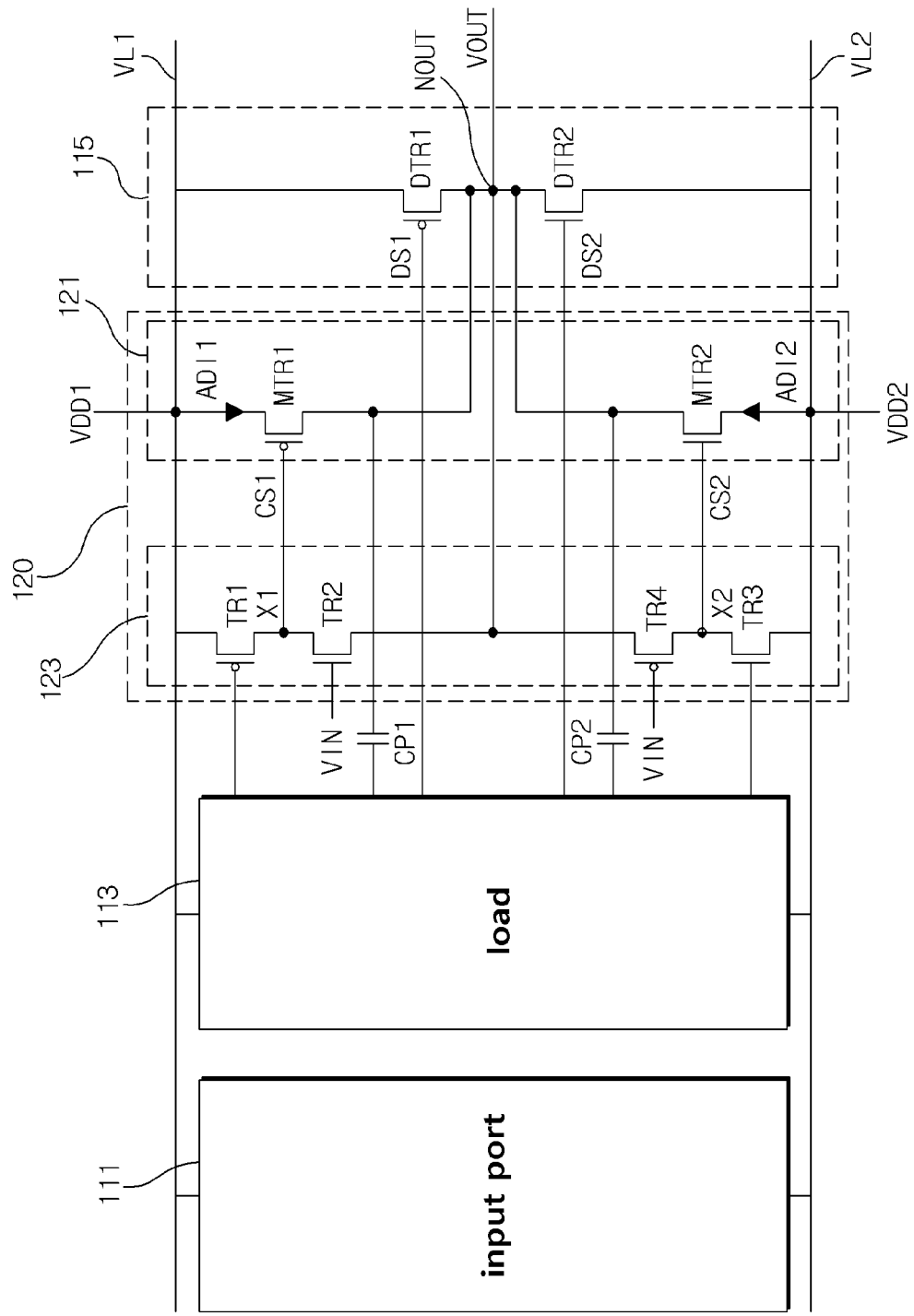
FIG. 3 is a view showing in detail a buffer circuit according to an example.

FIG. 3 is a view showing in detail the buffer circuit according to an example. Referring to the examples of FIGS. 1 to 3, the output port 115 may receive power source voltages VDD1 and VDD2 by being connected to power lines VL1 and VL2. For example, a first power source voltage VDD1 may be greater than a second power source voltage VDD2.

The output port 115 may include two driving transistors DTR1 and DTR2. According to an example, the output port 115 may include a first driving transistor DTR1 connected between the first power line VL1 and an output node NOUT, and a second driving transistor DTR2 connected to a second power line VL2 and the output node NOUT.

According to an example, the first driving transistor DTR1 may be a PMOS transistor, and the second driving transistor DTR2 may be an NMOS transistor. In such an example, a gate terminal of the first driving transistor DTR1 may be connected to the load 113, a source terminal of the first driving transistor DTR1 may be connected to the first power line VL1, and a drain terminal of the first driving transistor DTR1 may be connected to the output node NOUT. Additionally, a gate terminal of the second driving transistor DTR2 may be connected to the load 113, a source terminal of the second driving transistor DTR2 may be connected to the second power line VL2, and a drain terminal of the second driving transistor DTR2 may be connected to the output node NOUT.

The first driving transistor DTR1 may be turned on in response to receiving a first driving signal DS1 transferred from the load 113, and the second driving transistor DTR2 may be turned on by receiving a second driving signal DS2 transferred from the load 113. According to an example, the first driving transistor DTR1 may be a pull-up transistor, and the second driving transistor DTR2 may be a pull-down transistor.

The first driving transistor DTR1 and the second driving transistor DTR2 may operate in a complementary manner. For example, when the first driving transistor DTR1 is turned on, the second driving transistor DTR2 may be turned off, and vice versa.

The adjustment current generating circuit 121 may be connected to the output node NOUT. According to an example, the adjustment current generating circuit 121 may include two adjustment transistors MTR1 and MTR2 for providing an adjustment current to the output node NOUT.

For example, the adjustment current generating circuit 121 may include a first adjustment transistor MTR1 connected between the first power line VL1 and the output node NOUT, and may include a second adjustment transistor MTR2 connected between the second power line VL2 and the output node NOUT.

According to a non-limiting example, the first adjustment transistor MTR1 may be a PMOS, and the second adjustment transistor MTR2 may be an NMOS. In such an example, a gate terminal of the first adjustment transistor MTR1 may be connected to the control circuit 123, a source terminal of the first adjustment transistor MTR1 may be connected to the first power line VL1, and a drain terminal of the first adjustment transistor MTR1 may be connected to the output node NOUT and the load 113. A gate terminal of the second adjustment transistor MTR2 may be connected to the control circuit 123, a source terminal of the second adjustment transistor MTR2 may be connected to the second power line VL2, and a drain terminal of the second adjustment transistor MTR2 may be connected to the output node NOUT and the load 113. For example, compensation capacitors CP1 and CP2 may be respectively connected between the adjustment transistors MTR1 and MTR2 and the load 113. In such an example, a first compensation capacitor CP1 may be connected between the first adjustment transistor MTR1 and the load 113, and a second compensation capacitor CP2 may be connected between the second adjustment transistor MTR2 and the load 113. The compensation capacitors CP1 and CP2 may be used for Miller compensation, where Miller compensation is a technique for stabilizing the circuit using capacitances with a negative feedback approach.

The first adjustment transistor MTR1 may be turned on in response receiving to a first control signal CS1 transferred from the control circuit 123, and the second adjustment transistor MTR2 may be turned on in response to receiving a second control signal CS2 transferred from the control circuit 123.

The control circuit 123 may output control signals CS1 and CS2 for activating the adjustment current generating circuit 121. According to an example, the control circuit 123 may include a first transistor TR1, a second transistor TR2, a third transistor TR3, and a fourth transistor TR4.

The first transistor TR1 may be connected to the first power line VL1, and the second transistor TR2 may be connected between the first transistor TR1 and the output node NOUT. According to an example, a first adjustment transistor MTR1 may be connected between the first transistor TR1 and the second transistor TR2.

According to a non-limiting example, the first transistor TR1 may be a PMOS transistor, and the second transistor TR2 may be an NMOS transistor. In such an example, a gate terminal of the first transistor TR1 may be connected to the load 113, a source terminal of the first transistor TR1 may be connected to the first power line VL1, and a drain terminal of the first transistor TR1 may be connected to a drain terminal of the second transistor TR2 and to a gate terminal of the first adjustment transistor MTR1. Also, in such an example, a gate terminal of the second transistor TR2 may receive the input voltage VIN, the drain terminal of the second transistor TR2 may be connected to the drain terminal of the first transistor TR1 and to the gate terminal of the first adjustment transistor MTR1, and a source terminal of the second transistor TR2 may be connected to the output node NOUT.

The second transistor TR2 may be turned on when an absolute value of a difference between the input voltage VIN and the output voltage VOUT is equal to or greater than an absolute value of a threshold voltage of the second transistor TR2. For example, when the second transistor TR2 is an NMOS, the second transistor TR2 may be turned on when a difference between the input voltage VIN and the output voltage VOUT is equal to or greater than a threshold voltage of the second transistor TR2.

Meanwhile, operational conditions of an NMOS and a PMOS may be substantially identical, but simply differing in sign. Thus, "a difference between the input voltage VIN and the output voltage VOUT," may correspond to an absolute value. Accordingly, hereinafter, for convenience of description, in the examples, it may be assumed that a difference between the input voltage VIN and the output voltage VOUT being equal to or greater than a threshold voltage means that an absolute value of a difference between the input voltage VIN and the output voltage VOUT is equal to or greater than an absolute value of a threshold voltage, given that the use of the absolute value operation results in a magnitude of the relevant calculation, in that sign is not important to these considerations.

According to a non-limiting example, the third transistor TR3 may be an NMOS transistor, and the fourth transistor TR4 may be a PMOS transistor. In such an example, a gate terminal of the third transistor TR3 may be connected to the load 113, a source terminal of the third transistor TR3 may be connected to the second power line VL2, and a drain terminal of the third transistor TR3 may be connected to a drain terminal of the fourth transistor TR4 and a gate terminal of a second adjustment transistor MTR2. Also, in such an example, a gate terminal of the fourth transistor TR4 may receive the input voltage VIN, the drain terminal of the fourth transistor TR4 may be connected to the drain terminal of the third transistor TR3 and the gate terminal of the second adjustment transistor MTR2, and a source terminal of the fourth transistor TR4 may be connected to the output node NOUT.

In an example, the fourth transistor TR4 may be turned on when a difference between the input voltage VIN and the output voltage VOUT is equal to or greater than a threshold voltage of the fourth transistor TR4.

Hereinafter, referring to the example of FIG. 3, an operation of the slew rate adjusting circuit 120 is described in further detail. As described in further detail above, a time, that is, a transition time, may elapse during a transition from the input voltage VIN to the output voltage VOUT, and the slew rate adjusting circuit 120 of an example may be able to improve a slew rate without causing an increase in current consumption. According to an example, threshold voltages of all transistors shown in the example of FIG. 3 may be identical.

Operations of the slew rate adjusting circuit 120 when the first driving transistor DTR1 is turned on are to be described in further detail. In a pull-up operation, when the input voltage VIN is input, the first driving transistor DTR1 may be turned on by controlling the load 113, and may output the output voltage VOUT.

In such an example, it may be assumed that a difference between the input voltage VIN and the output voltage VOUT may exceed a threshold voltage. For example, the input voltage VIN may match a first power source voltage VDD1. In such an example, the second transistor TR2 may turned on, as a result. Accordingly, the first adjustment transistor MTR1 may be turned on by receiving a voltage from a node X1. In other words, the second transistor TR2 may output a first control signal CS1 for turning on the first adjustment transistor MTR1. When the first adjustment transistor MTR1 is turned on, a first adjustment current ADI may be transferred into the output node NOUT by the first adjustment transistor MTR1 on the basis of the first power source voltage. As a result, a transition time to the output voltage VOUT in the output node NOUT may decrease, and thus a slew rate of the output port 115 may increase as a result.

For example, first adjustment current ADI1 may be provided from the first power line VL1 into the output node NOUT through the first adjustment transistor MTR1.

In other words, the slew rate adjusting circuit 120 may increase a slew rate of the output port 115 when a difference between the input voltage VIN and the output voltage VOUT exceeds a threshold voltage.

Subsequently, when a difference between the input voltage VIN and the output voltage VOUT does not exceed a threshold voltage, the second transistor TR2 may be turned off, and the first adjustment transistor MTR1 may be turned off by receiving a voltage from the node X1. In other words, the second transistor TR2 may output a first control signal CS1 for turning off the first adjustment transistor MTR1. The output voltage VOUT may be output by turning off the first adjustment transistor MTR1, and by only turning on the first driving transistor DTR1.

In other words, the slew rate adjusting circuit 120 may be deactivated when a difference between the input voltage VIN and the output voltage VOUT does not exceed a threshold voltage.

Operations of the slew rate adjusting circuit 120 when the second driving transistor DTR2 is turned on are similar to the operations discussed in further detail, above. In pull-down operation, when the input voltage VIN is input, second driving transistor DTR2 may be turned on by a control of the load 113, and may output the output voltage VOUT.

In such an example, it may be assumed that a difference between the input voltage VIN and the output voltage VOUT exceeds a threshold voltage. For example, the input voltage VIN may be a second power source voltage VDD2. In such an example, the fourth transistor TR4 may be turned on, and the second adjustment transistor MTR2 may be turned on by receiving a voltage from a node X2. In other words, the fourth transistor TR4 may output a second control signal CS2 for tuning on the second adjustment transistor MTR2. The second adjustment transistor MTR2 may be turned on as a result, and thus second adjustment current AD12 may be transferred into the output node NOUT by the second adjustment transistor MTR2 based on the second power source voltage VDD2. As a result, a transition time to the output voltage VOUT in the output node NOUT may decrease, and thus a slew rate of the output port 115 may increase as a result.

For example, the second adjustment current AD12 may be provided from the second power line VL2 into the output node NOUT through the second adjustment transistor MTR2.

Subsequently, when a difference between the input voltage VIN and the output voltage VOUT does not exceed a threshold voltage, the fourth transistor TR4 may be turned off, and the second adjustment transistor MTR2 may be turned off by receiving a voltage from a node X2. In other words, the fourth transistor TR4 may output a second control signal CS2 for turning off the second adjustment transistor MTR2. The output voltage VOUT may be output by turning off the second adjustment transistor MTR2 and by only turning on second driving transistor DTR2.

Accordingly, the slew rate adjusting circuit 120 according to examples may increase a slew rate of the output port 115 by providing adjustment current ADI into the output port 115. In particular, adjustment current ADI provided from the slew rate adjusting circuit 120 may not flow into the driving transistors DTR1 and DTR2, and thus changes in current consumption in the driving transistors may not occur.

In other words, the slew rate adjusting circuit 120 according to an example may increase a slew rate of the output port 115 without causing an increase in current consumption of the output port 115. In other words, the device may be prevented from being overheated where the increased slew rate would otherwise lead to a high current consumption that would generate a large amount of heat production.

In addition, according to the slew rate adjusting circuit 120 according to examples, a current level of the adjustment current ADI may be determined based on a difference between the input voltage VIN and the output voltage VOUT, that is, a characteristic of the transistor, and when a difference between the input voltage VIN and the output voltage VOUT becomes large, an improvement in slew rate may be achieved, in that the slew rate may be increased as a result of features of examples.

Figure 4:
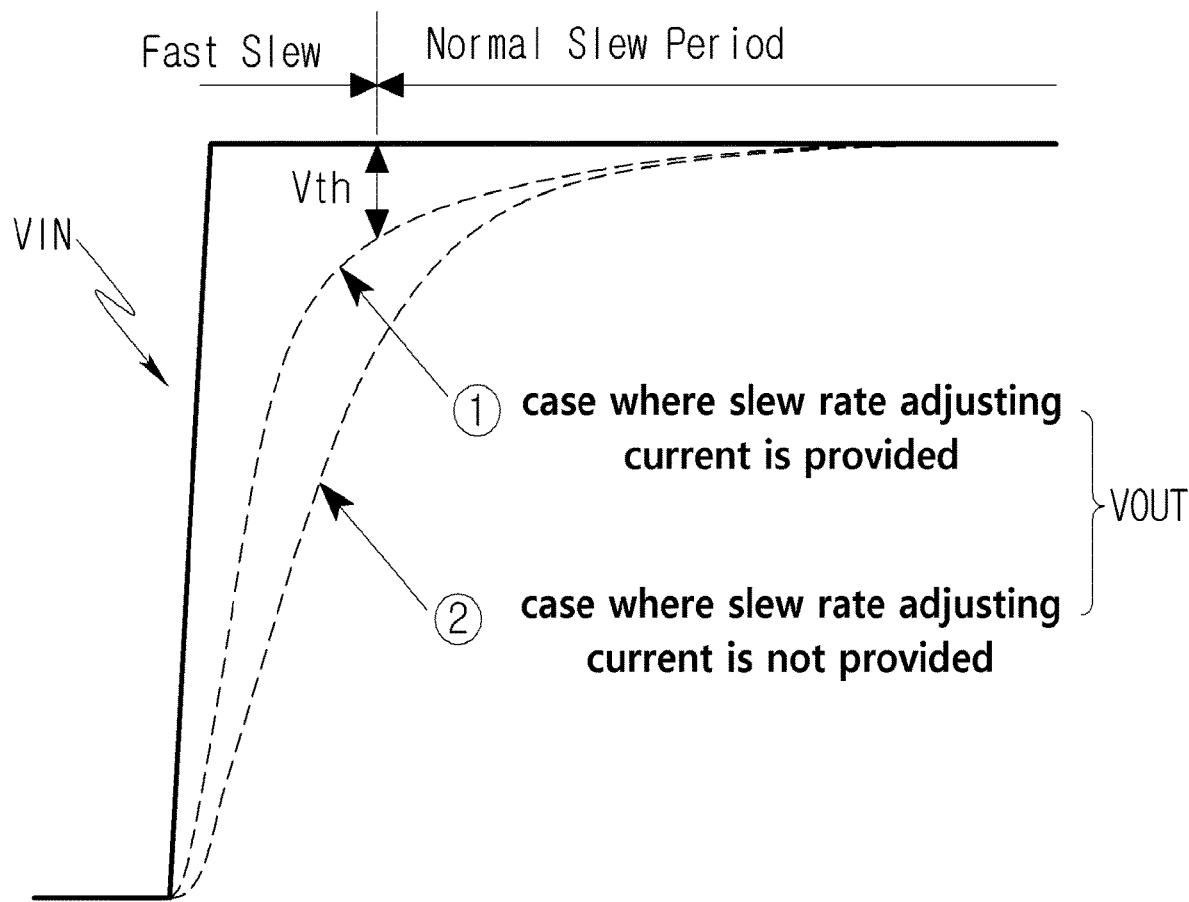
FIG. 4 is a view of a graph showing an output voltage according to whether or not the slew rate adjusting circuit is present according to an example.

FIG. 4 is a view of a graph showing an output voltage according to whether or not the slew rate adjusting circuit is present according to examples. Referring to the examples of FIGS. 1 to 4, it is confirmed by the illustrated information presented in the graph of FIG. 4 that a slew rate ① of the output port when the slew rate adjusting circuit 120 according to an example is present may be greater than a slew rate ② of the output port when the slew rate adjusting circuit 120 is not provided. Particularly, as described in further detail above, the slew rate adjusting circuit 120 may increase a slew rate of the output port 115 by providing adjustment current ADI to the output port 115 when a difference between the input voltage VIN and the output voltage VOUT exceeds a threshold voltage, shown in FIG. 4 as the fast slew section.

Figure 5:
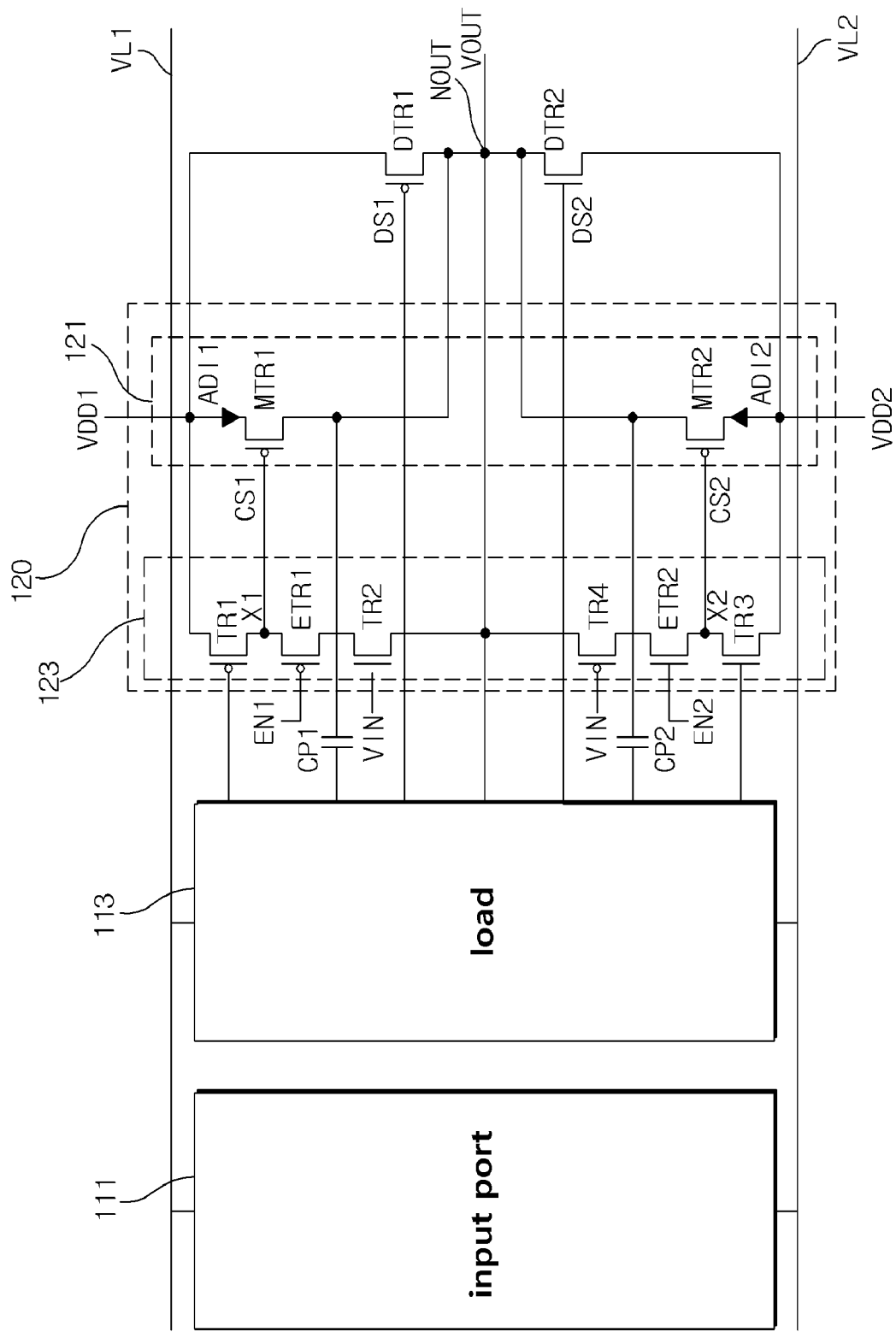
FIG. 5 is a view showing in detail a buffer circuit according to an example.

FIG. 5 is a view showing in detail a buffer circuit according to an example. Referring to the examples of FIGS. 1 to 5, the control circuit 123 of the example of FIG. 5 may be identical to the control circuit 123 of the example of FIG. 4, but the control circuit 123 of the example of FIG. 5 may differ in that it may further include enable transistors ETR1 and ETR2.

A first enable transistor ETR1 may be connected between the first transistor TR1 and the second transistor TR2, and a second enable transistor ETR2 may be connected between the third transistor TR3 and the fourth transistor TR4. According to a non-limiting example, the first enable transistor ETR1 may be a PMOS transistor, and the second enable transistor ETR2 may be an NMOS transistor.

For example, the first enable transistor ETR1 may be turned on in response to receiving a first enable signal EN1. A source terminal of the first enable transistor ETR1 may be connected between the drain terminal of the first transistor TR1 and the gate terminal of the first adjustment transistor MTR1. A drain terminal of the first enable transistor ETR1 may be connected to the drain terminal of the second transistor TR2. The second enable transistor ETR2 may be turned on in response to receiving a second enable signal EN2. A source terminal of the second enable transistor ETR2 may be connected between the drain terminal of the third transistor TR3 and the gate terminal of the second adjustment transistor MTR2. A drain terminal of the second enable transistor ETR2 may be connected to the drain terminal of the fourth transistor TR4.

According to a non-limiting example, a first enable signal EN1 provided to the first enable transistor ETR1 may be a second power source voltage VDD2 or a ground voltage, and a second enable signal EN2 provided to the second enable transistor ETR2 may be a first power source voltage VDD1, but EN1 and EN2 not limited to such examples, and other voltages may be used for EN1 and/or EN2 in other examples.

A determination of whether or not to output control signals CS1 and CS2 may be set through manipulating the enable transistors ETR1 and ETR2. According to an example, whether or not to turn on the second transistor TR2 may be determined on the basis of whether or not the first enable transistor ETR1 is turned on. Accordingly, whether or not to output the first control signal CS1 may be determined based on such approaches, as well. In addition, whether or not to turn on the fourth transistor TR4 may be determined based on whether or not the second enable transistor ETR2 is turned on. Accordingly, whether or not to output the second control signal CS2 may be determined based on such approaches, as well.

In other words, the enable transistors ETR1 and ETR2 of the example of FIG. 5 may be transistors for setting whether or not to enable the slew rate adjusting circuit 120. When the enable transistors ETR1 and ETR2 are turned off, the slew rate adjusting circuit 120 may be also deactivated accordingly, and when the enable transistors ETR1 and ETR2 are turned on, the slew rate adjusting circuit 120 may also be activated accordingly.

Operations of the slew rate adjusting circuit 120 when the enable transistors ETR1 and ETR2 are turned are is identical to those of the slew rate adjusting circuit 120 described with reference to the example of FIG. 4, above, and thus a description of such operations is omitted, for brevity.

Figure 6:
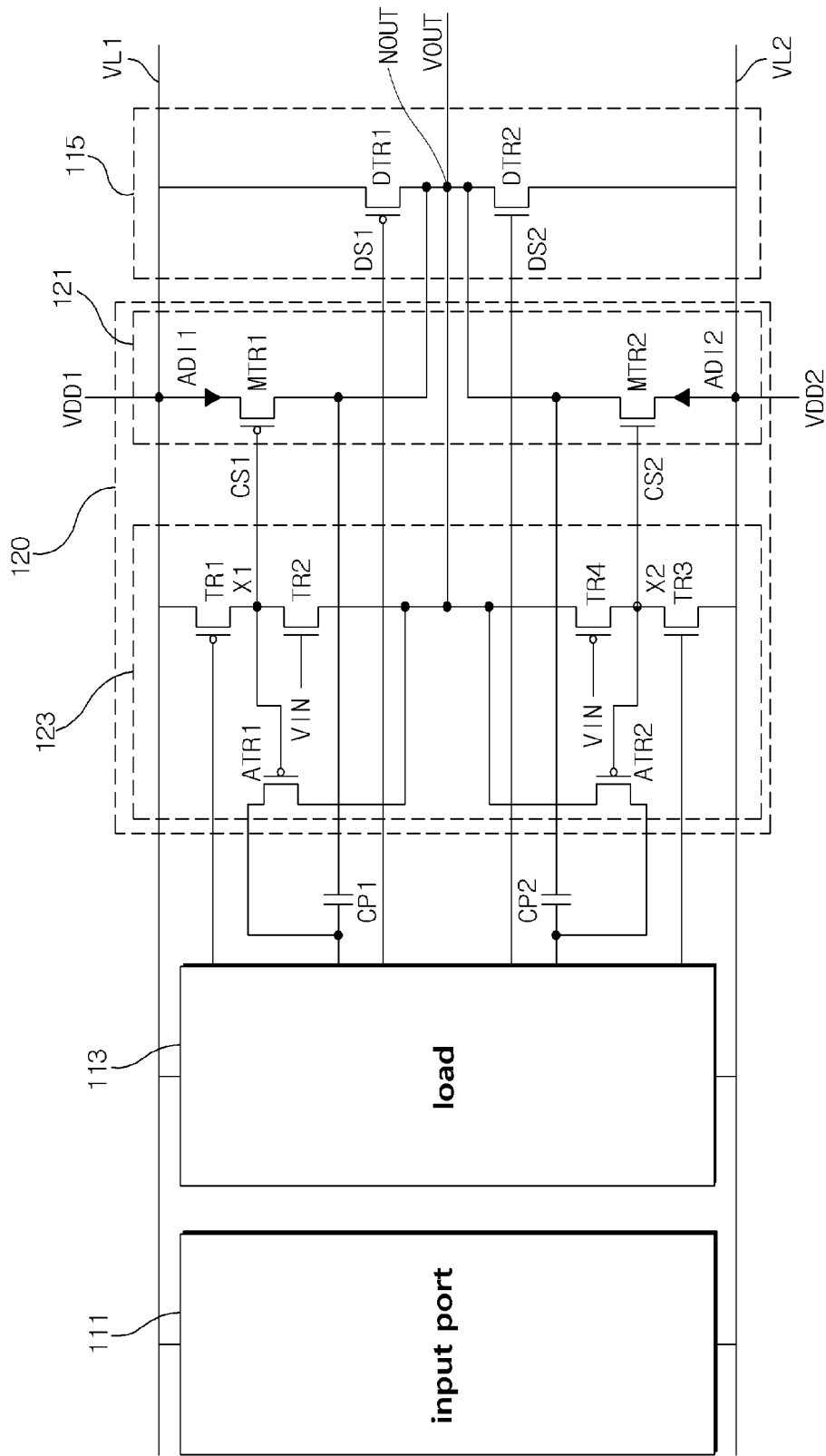
FIG. 6 is a view showing in detail a buffer circuit according to an example.

FIG. 6 is a view showing in detail a buffer circuit according to an example. Referring to the examples of FIGS. 1 to 6, the control circuit 123 of the example of FIG. 6 may be identical to the control circuit 123 of FIG. 4 differing in further including a first additional transistor ATR1 and a second additional transistor ATR2.

The first additional transistor ATR1 may be connected to the first transistor TR1, the first adjustment transistor MTR1, the load 113, and the second transistor TR2. The second additional transistor ATR2 may be connected to the third transistor TR3, the second adjustment transistor MTR2, the load 113, and the fourth transistor TR4. According to an example, the first additional transistor ATR1 may be a PMOS transistor, and the second additional transistor ATR2 may be an NMOS transistor.

For example, a gate terminal of the first additional transistor ATR1 may be connected between the first transistor TR1 and the second transistor TR2, a source terminal of the first additional transistor ATR1 may be connected to the load 113 and the first compensation capacitor CP1, and a drain terminal of the first additional transistor ATR1 may be connected to the source terminal of the second transistor TR2. A gate terminal of the second additional transistor ATR2 may be connected between the third transistor TR3 and the fourth transistor TR4, a source terminal of the second additional transistor ATR2 may be connected between the load 113 and the second compensation capacitor CP2, and a drain terminal of the second additional transistor ATR2 may be connected to the source terminal of the fourth transistor TR4.

The operation of the slew rate adjusting circuit 120 when the first driving transistor DTR1 is turned on is described in further detail, below. In pull-up operation, when the input voltage VIN is input, the first driving transistor DTR1 may be turned on based on a controlling of the load 113, and the first driving transistor DTR1 may output the output voltage VOUT.

In such an example, it may be assumed that a difference between the input voltage VIN and the output voltage VOUT exceeds a threshold voltage. For example, the input voltage VIN may be a first power source voltage VDD1. In such an example, the second transistor TR2 may be turned on. Accordingly, both of the first adjustment transistor MTR1 and the first additional transistor ATR1 may be turned on by receiving a voltage from a node X1. When both of the first adjustment transistor MTR1 and the first additional transistor ATR1 are turned on, first adjustment current ADI1 may be transferred into the output node NOUT by the first adjustment transistor MTR1, on the basis of the first power source voltage VDD1. Additionally, differing from the example of FIG. 4, first additional current may be also transferred into the output node NOUT by the first additional transistor ATR1. As a result, a transition time to the output voltage VOUT in the output node NOUT may decrease, and thus a slew rate of the output port 115 may increase, accordingly.

For example, the first additional current may be provided from the load 113 into the output node NOUT through the first additional transistor ATR1.

Assuming that remaining configurations, other than the inclusion of the first additional transistor ATR1, of the circuit are identical, an increase in slew rate by the slew rate adjusting circuit 120 of the example of FIG. 6 may be greater than an increase in slew rate occurring by the use of the slew rate adjusting circuit 120 of FIG. 4.

Subsequently, when a difference between the input voltage VIN and the output voltage VOUT does not exceed a threshold voltage, the second transistor TR2 may be turned off, and the first adjustment transistor MTR1 and the first additional transistor ATR1 may be turned off by a voltage of a node X1, as well. The output voltage VOUT is output by only turning on the first driving transistor DTR1.

Operations of the slew rate adjusting circuit 120 when second driving transistor DTR2 is turned on are similar to those discussed above. In a pull-down operation, when the input voltage VIN is input, second driving transistor DTR2 may be turned on by a control of the load 113, and may output the output voltage VOUT, accordingly.

In this disclosure, it is assumed that a difference between the input voltage VIN and the output voltage VOUT may exceed a threshold voltage. For example, the input voltage VIN may be a second power source voltage VDD2. In such an example, the fourth transistor TR4 may be turned on. Accordingly, both of the second adjustment transistor MTR2 and the second additional transistor ATR2 may be turned on by receiving a voltage from a node X2. When both of the second adjustment transistor MTR2 and the second additional transistor ATR2 are turned on, second adjustment current ADI2 may be transferred to the output node NOUT by the second adjustment transistor MTR2 based on the second power source voltage VDD2. Additionally, distinct from the example of FIG. 4, second additional current may be also be transferred to the output node NOUT by the second additional transistor ATR2. As a result, a transition time to the output voltage VOUT in the output node NOUT may decrease, and thus a slew rate of the output port 115 may increase, accordingly.

For example, the second additional current may be provided from the load 113 to the output node NOUT through the second additional transistor ATR2.

Subsequently, when a difference between the input voltage VIN and the output voltage VOUT does not exceed a threshold voltage, the fourth transistor TR4 may be turned off, and the second adjustment transistor MTR2 and the second additional transistor ATR2 may be turned off by receiving a voltage from the node NOUT. The output voltage VOUT may be output by only turning on second driving transistor DTR2.

In examples, when sizes of respective transistors of the slew rate adjusting circuit 120 are appropriately adjusted, such as in keeping with the discussion above, as a non-limiting example, the sum of dimensions or sizes of transistors included in the slew rate adjusting circuit 120 of the example of FIG. 6 may be identical to the sum of dimensions of transistors included in the slew rate adjusting circuit 120 of the example of FIG. 4.

Figure 7:
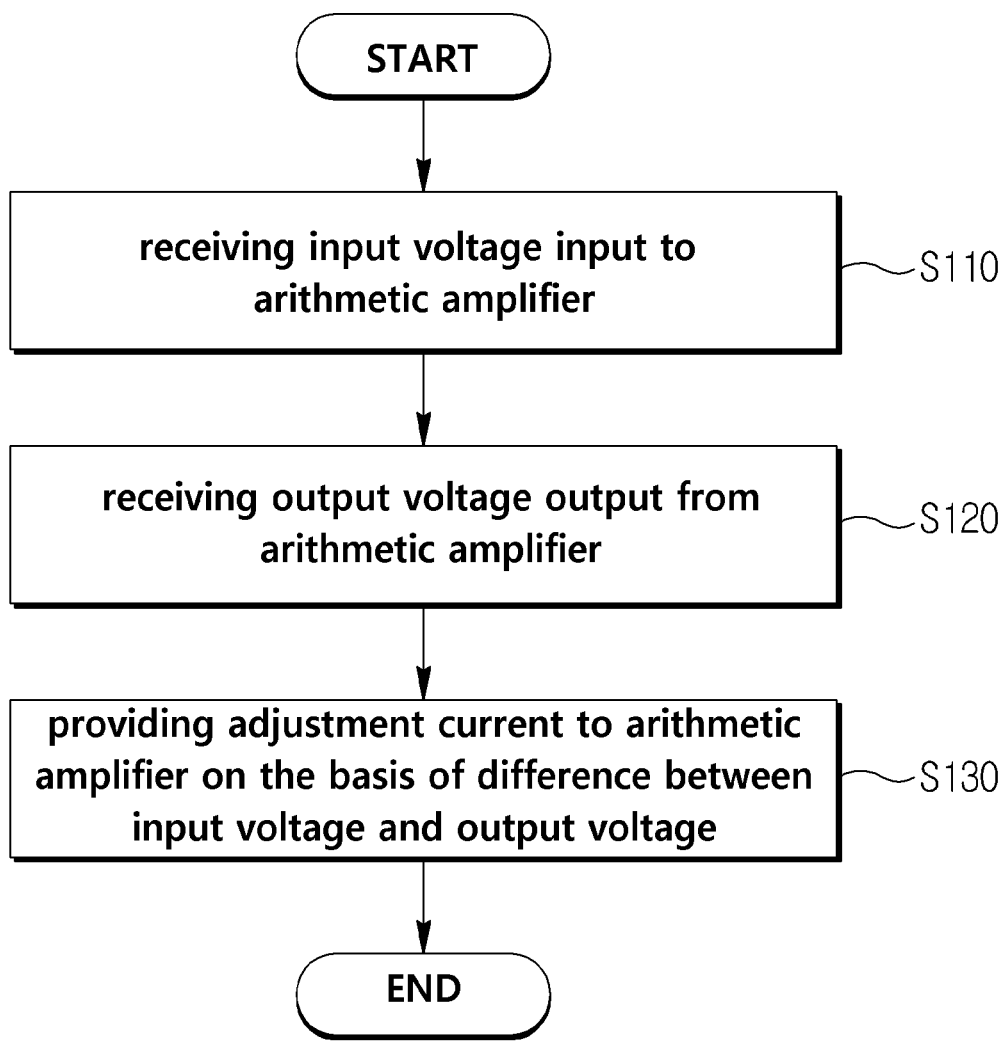
FIG. 7 is a view showing a flowchart of a slew rate adjusting method according to an example.

FIG. 7 is a view showing a flowchart of a slew rate adjusting method according to an example. The slew rate adjusting method shown in the example of FIG. 7 may be performed by the slew rate adjusting circuit 120 as described with reference to the examples of FIGS. 1 to 6.

Referring to the examples of FIGS. 1 to 7, in S110, the slew rate adjusting circuit 120 may receive an input voltage VIN input into the arithmetic amplifier 110. According to an example, the input voltage VIN input to the arithmetic amplifier 110 may be input into at least one of the transistors included in the slew rate adjusting circuit 120.

In S120, the slew rate adjusting circuit 120 may receive an output voltage VOUT output from the arithmetic amplifier 110. According to an example, the output voltage VOUT output from arithmetic amplifier 110 may be input to at least one of transistors included in the slew rate adjusting circuit 120.

In S130, the slew rate adjusting circuit 120 may provide an adjustment current ADI to the output port 115 of the arithmetic amplifier 110 on the basis of a difference between the input voltage VIN and the output voltage VOUT. As described above, when a difference between the input voltage VIN and the output voltage VOUT is equal to or greater than a reference voltage, the slew rate adjusting circuit 120 may decrease a transition time to the output voltage VOUT by providing the adjustment current ADI to the arithmetic amplifier 110.

In other words, when a difference between the input voltage VIN and the output voltage VOUT is equal to or greater than a reference voltage, the slew rate adjusting circuit 120 may decrease a transition time to the output voltage VOUT by additionally providing an adjustment current ADI to the arithmetic amplifier 110. When a difference between the input voltage VIN and the output voltage VOUT is smaller than a reference voltage, the slew rate adjusting circuit 120 may not provide an adjustment current ADI to the arithmetic amplifier 110. Accordingly, a slew rate of an example where a difference between the input voltage VIN and the output voltage VOUT is equal to or greater than the reference voltage may be greater than a slew rate of a case where a difference between the input voltage VIN and the output voltage VOUT is smaller than the reference voltage.

According to an example, the slew rate adjusting circuit 120 may determine a current level of an adjustment current ADI on the basis of a difference between the input voltage VIN and the output voltage VOUT. Accordingly, when a difference between the input voltage VIN and the output voltage VOUT becomes large, a slew rate may become large as well, and when a difference between the input voltage VIN and the output voltage VOUT becomes small, a slew rate may become small as well. Accordingly, the slew rate adjusting circuit 120 may thus adaptively adjust a transition time to the output voltage VOUT according to a gap in magnitude between the output voltage VOUT and the input voltage VIN.

Figure 8:
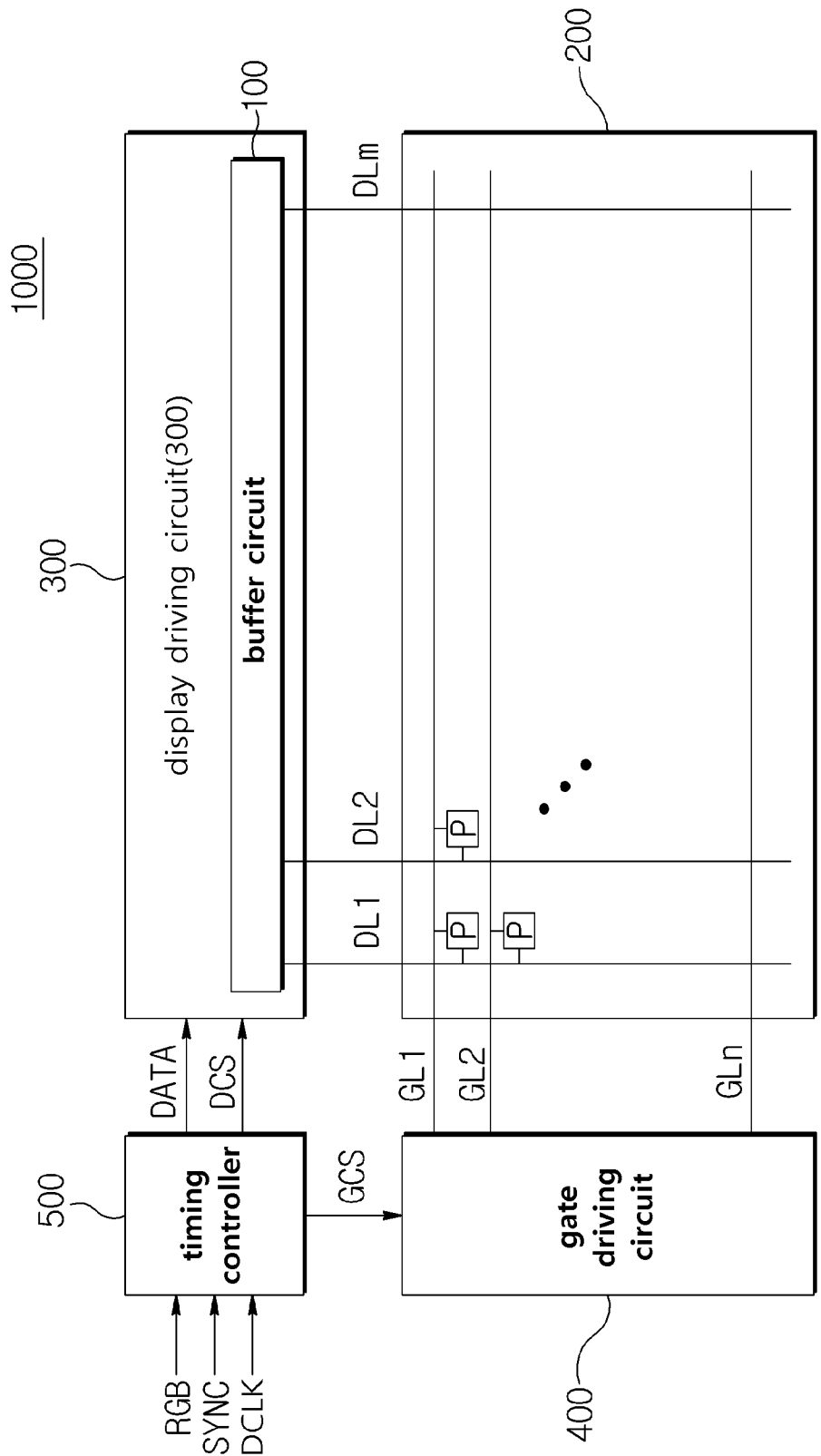
FIG. 8 is a view conceptually showing a display device including a buffer circuit according to an example.

FIG. 8 is a view conceptually showing a display device including a buffer circuit according to an example. Referring to the example of FIG. 8, a display device 1000 may include a display panel 200, a display driving circuit 300, a gate driving circuit 400, and a timing controller 500. However, this is a non-limiting example, and there may be other elements present in addition to and/or instead of these elements in other examples.

According to examples, the display device 1000 may be a device capable of displaying an image or video. For example, the display device 1000 may refer to a smartphone, a tablet personal computer, a mobile phone, a video phone, an e-book reader, a computer, a camera, or a wearable device, as non-limiting examples, but the display device 1000 is not limited to these enumerated examples and other devices with display activities are used as the display device 1000 in other examples.

The display panel 200 may include a number of sub-pixels P arranged in rows and columns. For example, the display panel 200 may be implemented using any one of a light emitting diode (LED) display, an organic LED (OLED) display, an active-matrix OLED (AMOLED) display, an electrochromic display (ECD), a digital mirror device (DMD), an actuated mirror device (AMD), a grating light valve (GLV), a plasma display panel (PDP), an electro luminescent display (ELD), and a vacuum fluorescent display (VFD), as non-limiting examples, but the display panel 200 is not limited to these enumerated examples, and other devices providing image/video display capabilities, such as through the use of sub-pixels are used as the display panel 200 in other examples.

The display panel 200 may include a plurality of gate lines GL1 to GLn, where n is a natural number, arranged in rows. The display panel 200 may also include a plurality of data lines DL1 to DLm, where m is a natural number, arranged in columns. Accordingly, display panel 200 may include sub-pixels P formed at respective intersections points between the plurality of gate lines GL1 to GLn and the plurality of data lines DL1 to DLm. The display panel 200 may include a plurality of horizontal lines, and one horizontal line may be configured with sub-pixels P connected to one gate line. During one horizontal period (1H), sub-pixels arranged in one horizontal line may be driven, and during a subsequent 1H, sub-pixels arranged in another horizontal line may be driven.

Each of the sub-pixels P may include a light emitting diode (LED) and a diode driving circuit independently driving the LED. Each diode driving circuit may be connected to one gate line and one data line, and each LED may be connected between the diode driving circuit and a power source voltage, for example, a ground voltage, as a non-limiting example.

Each diode driving circuit may include a switching element, for example, a thin film transistor (TFT), connected to the gate lines GL1 to GLn. When the switching element is turned on by providing a gate-on signal to the gate lines GL1 to GLn, the diode driving circuit may provide to the LED an image signal or pixel signal provided from the data lines DL1 to DLm connected to the diode driving circuit. The LED may output an optical signal in association with the image signal.

Each sub-pixel P may be one of a red element R outputting red light, a green element G outputting green light, and a blue element B outputting blue light. In the display panel 200, the red element, the green element, and the blue element may be arranged according to various methods. According to non-limiting examples, sub-pixels P of the display panel 200 may be arranged in an order of R, G, B, and G or B, G, R, and G in a repeated manner. For example, pixels P of the display panel 200 may be arranged according to an RGB stripe structure or an RGB Pentile structure, but the display panel 200 is not limited to these specific examples.

The gate driving circuit 400 may sequentially provide gate-on signals to the plurality of gate lines GL1 to GLn in response to a gate control signal GCS. For example, the gate control signal GCS may include a gate start pulse indicating a start time of outputting the gate-on signals and a gate shift clock controlling the timing of each gate-on signal.

When a gate start pulse is input, the gate driving circuit 400 may sequentially generate gate-on signals, for example, gate voltages that are logically high, in response to a gate shift clock, and may sequentially provide the gate-on signals to the plurality of gate lines GL1 to GLn. In such an example, during a time period in which the gate-on signals are not provided to the plurality of gate lines GL1 to GLn, gate-off signals, for example, gate voltage that are logically low, may be provided to the plurality of gate lines GL1 to GLn.

The display driving circuit 300 may convert digital image data DATA to analog image signals in response to a data control signal DCS, and may provide the resulting image signals to the plurality of data lines DL1 to DLm. The display driving circuit 300 may also provide image signals in association with one horizontal line to the respective plurality of data lines DL1 to DLm during a 1H horizontal period.

The display driving circuit 300 may include a buffer circuit 100 that transmits signals to the data lines DL1 to DLm. Such a buffer circuit 100 may be the buffer circuit 100 described with reference to the examples of FIGS. 1 to 6.

The buffer circuit 100 may transfer signals into the display panel 200. The display driving circuit 300 may convert image data DATA into image signals in response to receiving a data control signal DCS. The display driving circuit 300 may convert such image data into image signals of grayscale voltages in association with the image data DATA, and may output the resulting image signals into the plurality of data lines DL1 to DLm through the buffer circuit 100.

The timing controller 500 may receive external video image data RGB, and may perform processing on the video image data RGB or may generate image data DATA by converting the video image data according to a structure of the display panel 200. Also, the timing controller 500 may transmit the image data DATA into the display driving circuit 300.

The timing controller 500 may receive a plurality of control signals from an external host device. The control signals may include a horizontal synchronization signal Hsync, a vertical synchronization signal Vsync, shown collectively in the example of FIG. 8 as SYNC, and a clock signal DCLK.

The timing controller 500 may generate a gate control signal GCS, and a data control signal DCS for controlling the gate driving circuit 400 and the display driving circuit 300, respectively, on the basis of the received control signals. The timing controller 500 may also control various driving timings of the gate driving circuit 400 and the display driving circuit 300 on the basis of the gate control signal GCS and the data control signal DCS it receives.

According to an example, the timing controller 500 may control the gate driving circuit 400 so that the gate driving circuit 400 may provide gate-on signals to the plurality of gate lines GL1 to GLn based on the gate control signal GCS. The timing controller 500 may control the display driving circuit 300 so that the display driving circuit 300 may provide image signals to the plurality of data lines DL1 to DLm on the basis of the data control signal DCS.

Each configuration of the display device 1000 may be employed in a circuit that may be capable of performing the corresponding function.

The buffer circuit 100, arithmetic amplifier 110, input port 111, load 113, output port 115, slew rate adjusting circuit 120, adjustment current generating circuit 121, control circuit 123, display device 1000, display panel 200, display driving circuit 300, gate driving circuit 400, and timing controller 500 in FIGS. 1-8 that perform the operations described in this application are implemented by hardware components configured to perform the operations described in this application that are performed by the hardware components. Examples of hardware components that may be used to perform the operations described in this application where appropriate include buffers, transistors, controllers, sensors, generators, drivers, memories, comparators, arithmetic logic units, adders, subtractors, multipliers, dividers, integrators, and any other electronic components configured to perform the operations described in this application.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A slew rate adjusting circuit, comprising:
   an adjustment transistor configured to provide an adjustment current into an output port of an arithmetic amplifier in response to the adjustment transistor being turned on;
   a first transistor connected between a power line of the arithmetic amplifier and the adjustment transistor;
   a second transistor connected between the first transistor and an output node of the output port; and
   an enable transistor connected to the adjustment transistor, the first transistor, and the second transistor,
   wherein the enable transistor is configured to control whether or not the second transistor is turned on upon receiving an enable signal, and
   wherein the adjustment transistor is configured to be turned on by the second transistor in response to a difference between an input voltage and an output voltage being equal to or greater than a reference voltage.

2. The slew rate adjusting circuit of claim 1, wherein the adjustment current is provided from the power line into the output node through the adjustment transistor.

3. The slew rate adjusting circuit of claim 1,
   wherein the second transistor is configured to be turned on in response to the difference between the input voltage and the output voltage being equal to or greater than the reference voltage, and
   wherein the adjustment transistor is configured to be turned on in response to the second transistor being turned on, and the adjustment current is provided to the output node through the adjustment transistor in response to the adjustment transistor being turned on.

4. The slew rate adjusting circuit of claim 1,
   wherein the adjustment transistor, the first transistor, and the second transistor are metal-oxide-semiconductor field-effect transistors (MOSFETs), and
   wherein a source terminal of the second transistor is connected to the output node, a drain terminal of the second transistor is connected to a gate terminal of the adjustment transistor, a source terminal of the adjustment transistor is connected to the power line, and a drain terminal of the adjustment transistor is connected to the output node.

5. The slew rate adjusting circuit of claim 1,
   wherein the adjustment transistor and the second transistor are metal-oxide-semiconductor field-effect transistors (MOSFETs), and
   wherein a source terminal of the second transistor is connected to the output node, a drain terminal of the second transistor is connected to a gate terminal of the adjustment transistor, a source terminal of the adjustment transistor is connected to the power line, and a drain terminal of the adjustment transistor is connected to the output node.

6. The slew rate adjusting circuit of claim 1, wherein a positive adjustment current is provided through the adjustment transistor in response to the arithmetic amplifier operating through a pull-up current.

7. The slew rate adjusting circuit of claim 1, wherein a negative adjustment current is provided through the adjustment transistor in response to the arithmetic amplifier operating through a pull-down current.

8. The slew rate adjusting circuit of claim 1, further comprising an additional transistor connected to the adjustment transistor, the first transistor, and the second transistor,
  wherein the second transistor is configured to turn on the additional transistor in response to the difference between the input voltage and the output voltage being equal to or greater than the reference voltage, and
  wherein an additional current is provided to the output node in response to the additional transistor being turned on.

\* \* \* \* \*